United States Patent [19]

Beasley

[11] Patent Number: 5,845,874
[45] Date of Patent: Dec. 8, 1998

[54] SYSTEM AND METHOD FOR CREATING VISUAL IMAGES OF AIRCRAFT WAKE VORTICES

[75] Inventor: Graham D. Beasley, Sunnyvale, Calif.

[73] Assignee: Silicon Graphics, Inc., Mountain View, Calif.

[21] Appl. No.: 742,612

[22] Filed: Oct. 29, 1996

[51] Int. Cl.⁶ .................................................. G01M 9/00
[52] U.S. Cl. .............................. 244/1 R; 434/43; 73/147; 345/430
[58] Field of Search ..................................... 244/1 R, 199, 244/129.1; 434/43, 49; 73/147, 178 R, 861.22, 861.23, 861.24, 195, 196; 137/804; 340/703, 747, 729; 345/430, 439, 428, 507, 515

[56] References Cited

U.S. PATENT DOCUMENTS

| 4,586,038 | 4/1986 | Sims et al. ............................. 340/729 |
| 4,692,880 | 9/1987 | Merz et al. ............................ 345/430 |
| 4,974,176 | 11/1990 | Buchner et al. ...................... 340/729 |
| 5,438,654 | 8/1995 | Drebin et al. ........................ 345/428 |
| 5,471,572 | 11/1995 | Buchner et al. ...................... 345/428 |
| 5,544,524 | 8/1996 | Huyer et al. .......................... 73/147 |
| 5,600,060 | 2/1997 | Grant ..................................... 73/147 |

*Primary Examiner*—Galen L. Barefoot
*Attorney, Agent, or Firm*—Sterne, Kessler, Goldstein & Fox P.L.L.C.

[57] ABSTRACT

A system and method for creating visual images of aircraft wake vortices allows a user, such as an aircraft controller, to increase a number of airport transactions while maintaining a predetermined level of safety. Wake vortices are simulated in a three dimensional environment taking into account various aircraft, environmental, and atmospherical conditions. The simulated wake vortices are rendered from a perspective selectable by the user. The displayed image allows the user to direct aircraft around potentially harmful wake vortices.

42 Claims, 7 Drawing Sheets

SYSTEM AND METHOD FOR CREATING VISUAL IMAGES OF AIRCRAFT WAKE VORTICES

BACKGROUND OF THE INVENTION

1. Field of the Invention

The present invention relates generally to air traffic control systems, and more specifically, to displaying a visual image of a wake vortex created by an aircraft.

2. Related Art

A wake vortex is a disturbance in the air created by an aircraft that is much akin to the wake produced by boat in the water. Specifically, a pair of counter rotating wake vortices are produced by the wingtips of the aircraft. The wake vortices are created as a byproduct of the aircraft developing lift. For a fixed wing aircraft (i.e., airplanes, etc.), when a wing passes through the air, the air rolls up and back about a tip of the wing producing a wake vortex. The airplane produces two counter rotating wake vortices, one trailing behind the tip of each wing. Similar wake vortices are produced by rotary wing aircraft (i.e., helicopters, etc.).

The intensity of the turbulence within the wake vortex is directly proportional to the weight of the aircraft and inversely proportional to the wing span and the speed of the aircraft. Thus, the intensity of the turbulence of the wake vortex is greatest for large, heavy aircraft traveling at relatively slow speeds. These are precisely the conditions under which large aircraft operate during take-off and landing.

Wake vortices settle below and behind the aircraft, but tend to level off about 1000 feet below the flight path of the aircraft. The wake vortices may trail the aircraft for 10 or more miles. In still air, wake vortices decay slowly. Consequently, turbulence from the wake vortices may be encountered by trailing aircraft as long as 5 minutes after the passage of the aircraft that produced the wake vortices. When wake vortices reach the ground, they tend to move laterally outward over the ground at a speed of approximately 5 knots. A further discussion of wake vortices is found in "Wake Turbulence," *Federal Aviation Regulations and Airman's Information Manual*, Aviation Supplies and Academics, Inc., 1994, ("FARAIM"), which is incorporated herein by reference.

While wake vortices pose little problems for the aircraft that produced them, other aircraft (especially smaller ones) may experience the turbulence as a bumpy ride, as an unplanned roll, or, in the worse case, as a complete destruction of the aircraft. FARAIM, para. 7-54, p. 627. With respect to airports, the approach, climb path and runways areas tend to be prime habitat for potentially dangerous wake vortices. Furthermore, at airports having parallel runways (e.g., San Francisco), wave vortices may drift from one runway to the other in response to either their lateral motion or a crosswind.

Traditionally, in order to prevent accidents due to wake vortices, avoidance procedures were developed and adopted. FARAIM, para. 7-58, p. 623. These avoidance procedures are well documented and are included as a part of a pilot's training. In essence, the avoidance procedures are techniques whereby the pilot, in conjunction with an air traffic controller, attempts to avoid areas where wake vortices are likely to be encountered or waits until wave vortices have dissipated. FARAIM, para. 4-57, p. 494.

However, as air traffic continues to increase, air traffic controllers and pilots are faced with the difficult job of safely scheduling airport transactions (i.e., arrivals and departures). Conventional two-dimensional radar systems and the traditional wave vortex avoidance procedures will ultimately limit the number of transactions an airport can safely handle. This number will be well below the expected demand for airport transactions within the next several years.

What is needed is a system and method for increasing the number of airport transactions without decreasing safety.

SUMMARY OF THE INVENTION

The present invention is directed to a system and method for displaying wake vortices created by an aircraft. The present invention simulates wake vortices based on characteristics of the aircraft that is generating them. In addition, the present invention simulates the effects of atmospheric conditions such as wind, temperature, humidity, etc., on the wake vortices.

One embodiment of the present invention simulates wake vortices in three dimensions. In this embodiment, the wake vortices are rendered, or displayed, into a three-dimensional scene, or image, that a user, such as an air traffic controller, is able to manipulate. This allows the user to view the scene from different perspectives so that the relative locations of the aircraft and the wake vortices can be determined.

Another embodiment of the present invention renders an image of the aircraft and its wake vortices on a display for use by air traffic controllers. The air traffic controllers use input devices, i.e., a mouse, a keyboard, a joystick, etc., to manipulate the scene. This allows the air traffic controllers to schedule airport transactions, i.e., landings and takeoffs, so that incoming or outgoing aircraft will not pass through dangerous wake vortices generated by another aircraft. Because the present invention allows air traffic controllers to visualize the wake vortices, the air traffic controllers can schedule more transactions than conventional techniques which attempt to avoid areas where wake vortices are produced or to provide sufficient time for the wake vortices to dissipate between transactions.

Another embodiment of the present invention renders an image of wake vortices on a display for use by a pilot. This embodiment simulates and renders images of wake vortices produced by aircraft in close proximity to the pilot's aircraft. This embodiment may utilize a "heads up" display so that the pilot can identify and avoid wake vortices created by aircraft sharing the same airspace. In this case, the images of the wake vortices are superimposed over the actual aircraft so that the pilot is able to "see" the wake vortices.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE EMBODIMENTS

Example Environment

Figure 11:
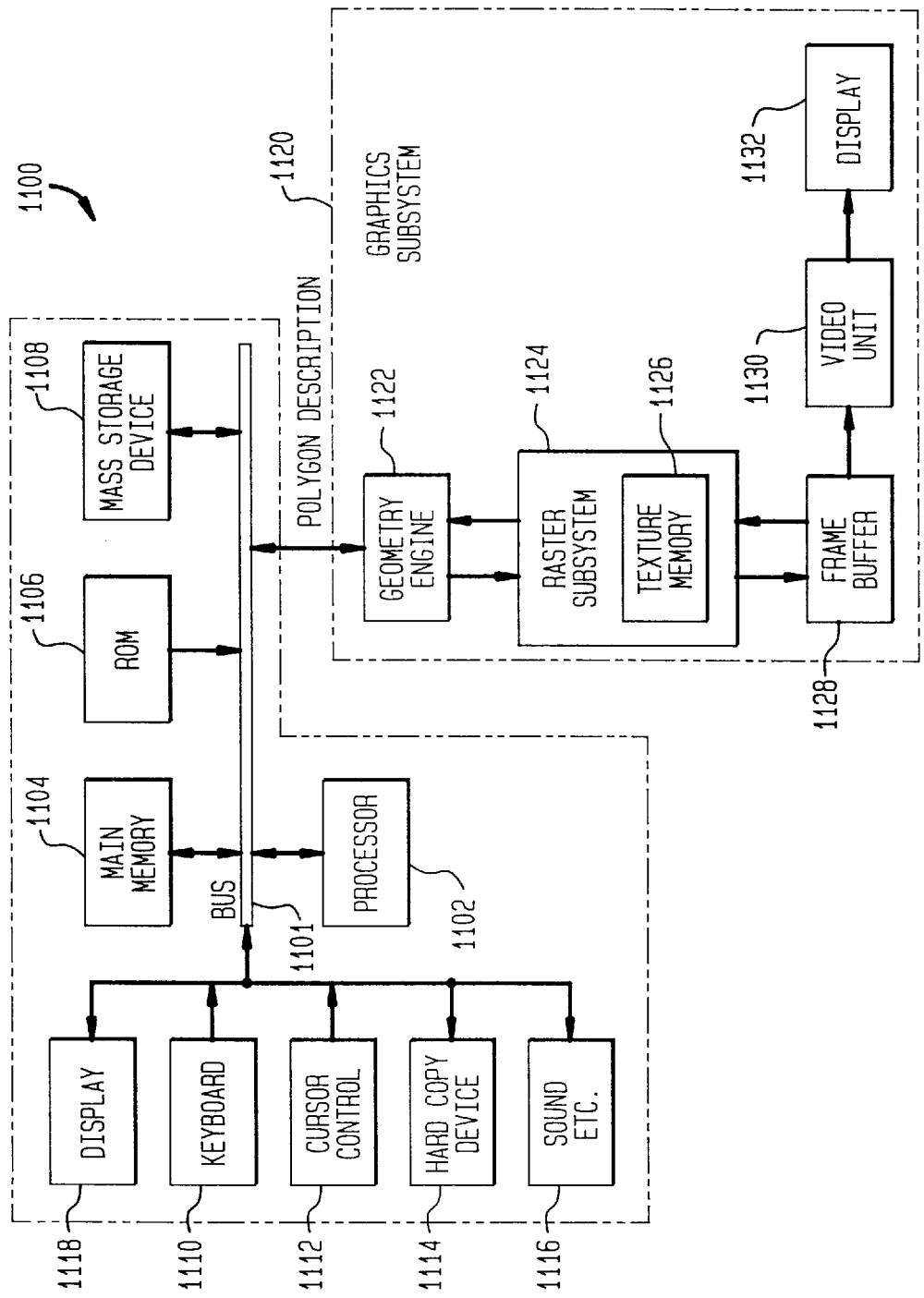
FIG. 11 is a block diagram of a computer graphics display system.

Referring to FIG. 11, a block diagram of a computer graphics display system 1100 is shown. System 1100 is exemplary only and it is not intended to limit the invention to application in this example environment. In fact, after reading the following description, it will become apparent to a person skilled in the relevant art how to implement the invention in alternate environments. System 1100 drives a graphics subsystem 1110 for generating textured display images according to the present invention. In a preferred embodiment, graphics subsystem 1110 is utilized as a high-end, interactive computer graphics workstation.

System 1100 includes a host processor 1102 coupled through a data bus 1101 to a main memory 1104, read only memory (ROM) 1106, and a mass storage device 1108. Mass storage device 1108 is used to store a vast amount of digital data relatively cheaply. For example, mass storage device 1108 can consist of one or more hard disk drives, floppy disk drives, optical disk drives, tape drives, CD ROM drives, or any number of other types of storage devices having media for storing data digitally.

Different types of input/output (I/O) devices are also coupled to processor 1102 for the benefit of an interactive user. Input devices include an alphanumeric keyboard 1110 and a cursor control device 1112 (e.g., a mouse, trackball, joystick, etc.). Input devices are used to input commands and information. Output devices include a hard copy device 1114, (e.g., a laser printer) for printing data or other information onto a tangible medium. A sound recording 1116 or video option and a display screen 1118 may be coupled to system 1000 to provide multimedia capabilities.

Graphics data is provided from processor 1102 through data bus 1101 to graphics subsystem 1120. Graphics subsystem 1120 includes a geometry engine 1122, a raster subsystem 1124 coupled to a texture memory 1126, a frame buffer 1128, a video unit 1130, and a display 1132.

The present invention is preferably implemented using software executing in an environment similar to that described above with respect to FIG. 11. In this document, the term "computer program product" is used to generally refer to removable storage device or ROM 1106. Computer programs (also called computer control logic) are stored in ROM 1106 or mass storage device 1108. Such computer programs, when executed, enable computer system 1100 to perform the features and functions of the present invention as discussed herein. Accordingly, such computer programs represent controllers of system 1100.

Wake Vortices

Figure 1:
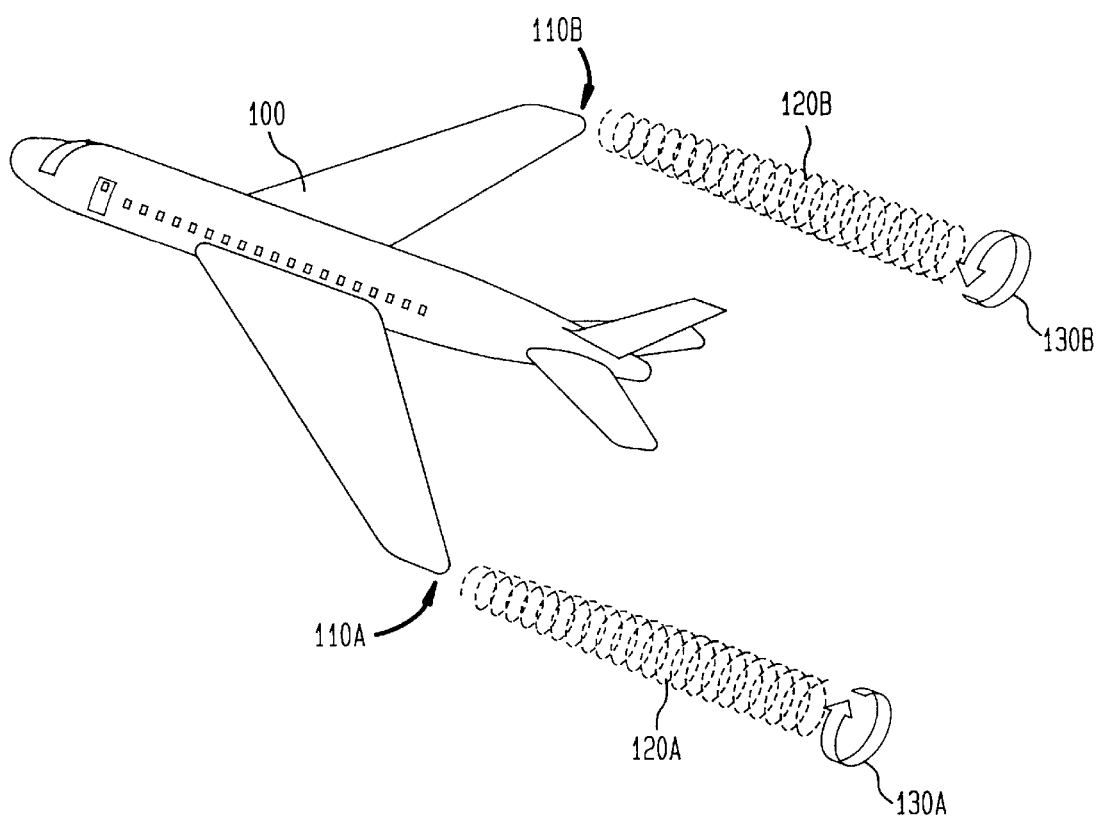
FIG. 1 illustrates an aircraft and its associated wake vortices.

FIG. 1 illustrates an aircraft 100 and its associated wake vortices 120. As shown, a wake vortex 120A is generated at a left wingtip 110A and a wake vortex 120B is generated at a right wingtip 110B. Wake vortices 120 are referred to as counter-rotating (i.e., they rotate in opposite directions) as shown by arrows 130. Wake vortex 120A off of left wingtip 110A rotates in a clockwise direction with respect to an aft view of aircraft 100 as shown by arrow 130A, whereas wake vortex 120B off of right wingtip 110B rotates in a counter-clockwise direction as shown by arrow 130B.

Figure 2:
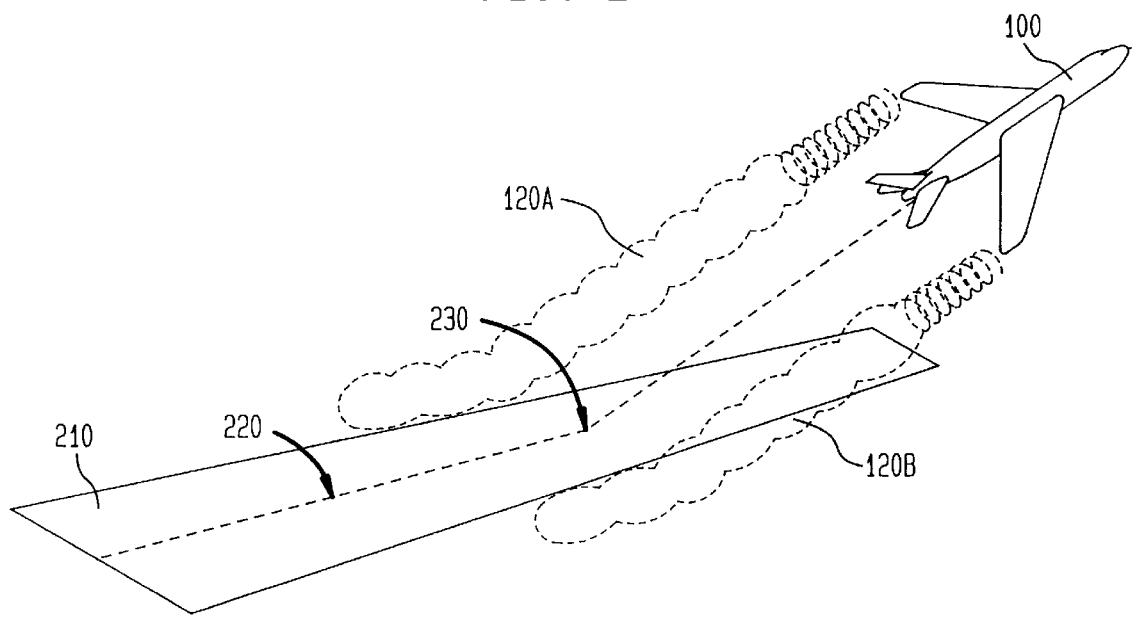
FIG. 2 illustrates an aircraft taking off from a runway and its associated wake vortices.

Wake vortices 120 are generated whenever aircraft 100 is generating lift. Wake vortices 120 are particularly strong and dangerous when produced by large, heavy aircraft during takeoff and landing. FIG. 2 illustrates a flight path 220 of aircraft 100 as it takes off from a runway 210. As shown in FIG. 2, aircraft 100 generates wake vortices 120 prior to a rotation point 230 as aircraft 100 begins to generate lift down flight path 220. Wake vortices 120 continue to be present during the flight of aircraft 100.

Figure 3:
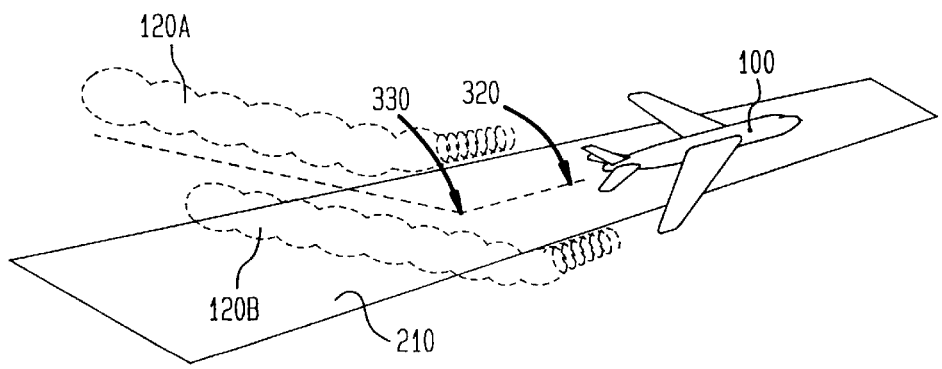
FIG. 3 illustrates an aircraft landing onto a runway and its associated wake vortices.

FIG. 3 illustrates a flight path 320 of aircraft 100 as it lands on runway 210. As shown in FIG. 3, wake vortices 120 follow aircraft 100 through a touchdown point 330 until aircraft 100 no longer is generating lift.

The wake vortices 120 in both FIG. 2 and FIG. 3 are potentially dangerous for other aircraft using runway 210, especially smaller, lighter aircraft. The problem with wake vortices 120 is that they are invisible to both the pilots of these other aircraft and the air traffic controllers who schedule the takeoffs and landings (referred to collectively as transactions) on runway 210.

The present invention solves this problem by simulating (i.e., modeling) and rendering (i.e., displaying) wake vortices 120 in order to enable air traffic controllers and pilots to visualize wake vortices 120. In one embodiment of the present invention, wake vortices 120 are displayed in a manner whereby the air traffic controllers can safely increase the number of transactions at an airport. In another embodiment of the present invention, wake vortices 120 are displayed in a manner whereby pilots can safely avoid the danger.

Figure 4:
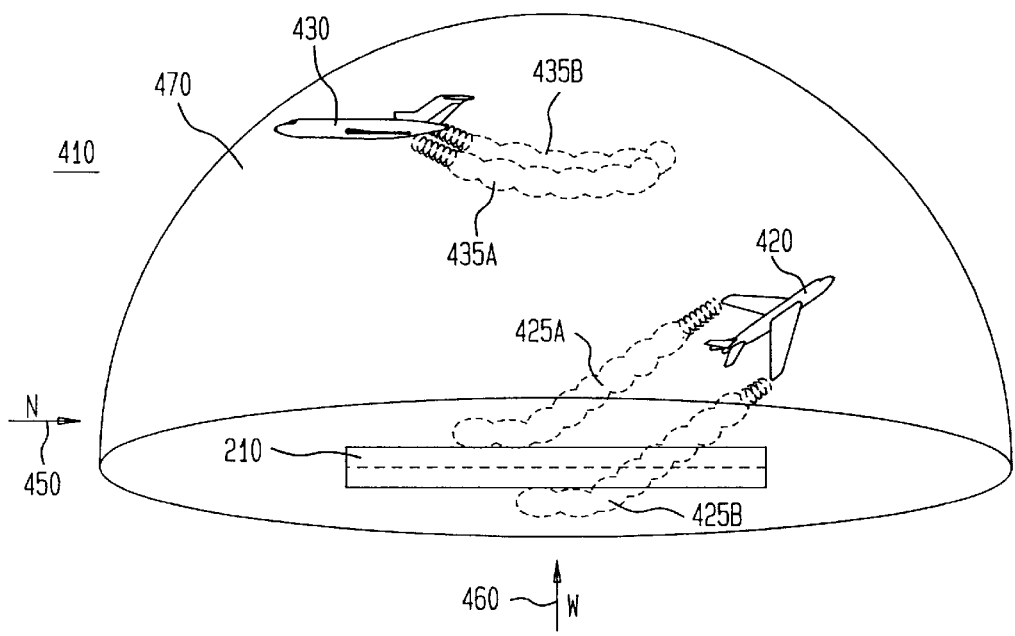
FIG. 4 illustrates a rendering of an airspace around a runway as viewed looking west.
Figure 5:
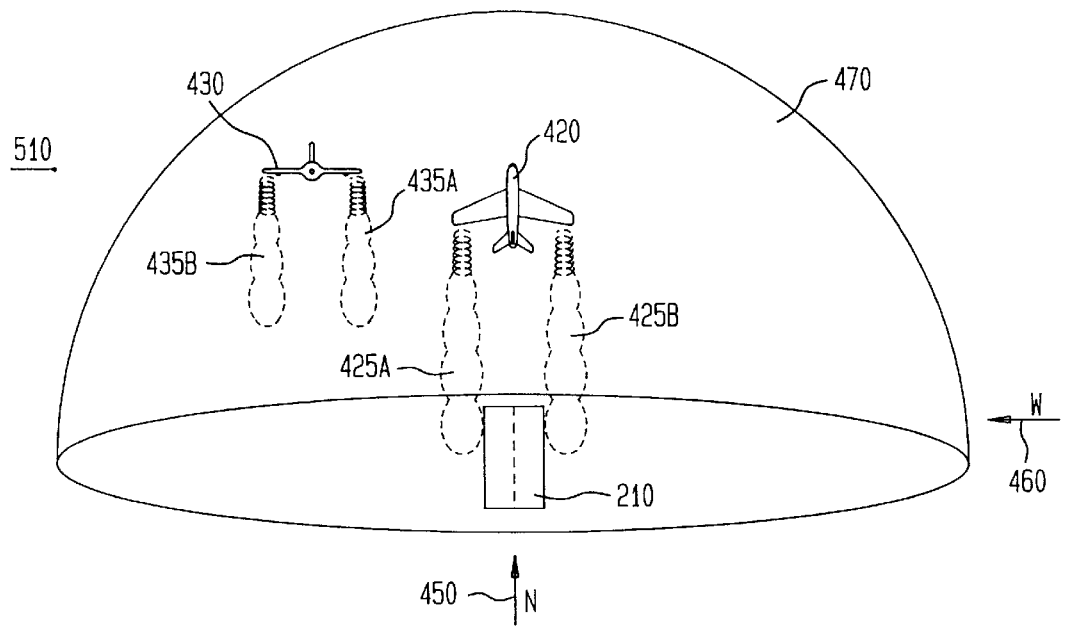
FIG. 5 illustrates a rendering of an airspace around a runway as viewed looking north.

FIG. 4 illustrates a rendering 410 of airspace 470 around runway 210 according to the present invention. FIG. 5 illustrates a rendering 5 10 of airspace 470 around runway 210 according to the present invention. Rendering 410 is a Westing view 460 of airspace 470. Rendering 510 is a Northing view 450 of airspace 470. Renderings 410, 510 each include two aircraft shown as an aircraft 420 and an aircraft 430. Renderings 410, 510 also each include a simulated pair of wake vortices for each aircraft 420, 430. As shown, aircraft 420 generates wake vortices 425A, 425B while aircraft 430 generates wake vortices 435A, 435B.

Renderings 410, 510 are each a two-dimensional depiction of a three-dimensional volume (i.e. airspace 470) around runway 210. As is well known, a model of a volume can be manipulated to obtain various two-dimensional depictions or views of the volume from different perspectives. For example, as mentioned above, rendering 410 is a Westing view 460 of airspace 470. In other words, rendering 410 depicts airspace 470 at it would appear to a viewer, such as an air traffic controller, looking westward into airspace 470. Rendering 510 is a Northing view 450 of airspace 470.

In other words, rendering 510 depicts airspace 470 as it would appear to the viewer looking northward into airspace 470. As can be seen from both rendering 410 and rendering 510, the relative spacing between the two aircraft 420, 430 and their associated wake vortices 425, 435 can only be fully visualized through viewing both views 450, 460 of airspace 470.

For example, the viewer viewing Westing view 460 of airspace 470 in FIG. 4 may not be able to definitively determine whether wake vortices 435 pose a potential problem for aircraft 420, and whether wake vortices 425 pose a potential problem for aircraft 430. One feature of the present invention is that the viewer is able to manipulate a model of airspace 470 (including aircrafts 420, 430, wake vortices 425, 435, runway 210, etc.) to obtain views from different perspectives. In one example, the viewer may be viewing rendering 410 which is Westing view 460 of airspace 470. The viewer may rotate the model of airspace 470 by ninety degrees in a clockwise fashion, as viewed from above, to obtain rendering 510 which corresponds to Northing view 450. Permitting the viewer to manipulate, in this case rotate, the model of airspace 470, allows the viewer to definitively determine whether wake vortices 425, 435 pose a potential problem for either of the two aircraft 420, 430.

In addition to rotating the model of airspace 470, various embodiments of the present invention include other manipulations such as scaling, sizing, zooming in on a particular volume, enlarging or restricting airspace 470, etc., as would be apparent. These and other manipulations of models of three-dimensional models are well known and as such are not described in further detail.

Conventional air traffic control displays and radar displays depict a fixed "god's eye" view of airspace 470. In other words, the viewer looks down through airspace 470 onto runway 410. These types of displays typically include altitude information in the form of a number accompanying an image or blip of the aircraft being displayed. Other displays use a color of the aircraft to indicate altitude information. However, numerical or color altitude information displayed as such do not enable the viewer to visualize the relative distances in three dimensions of the various displayed aircraft.

Modeling the Airspace

Modeling airspace 470 includes modeling aircraft 420, 430 and wake vortices 425, 435. "Modeling" includes generating a computer model of an object and applying forces to the model of the object to simulate or demonstrate how the object will react to those forces. Computer models of aircraft 420, 430 are well known. Computer models of wake vortices 425, 435 can be generated from documented characteristics of their creation and behavior.

In addition to modeling aircraft 420, 430 and wake vortices 425, 435, weather and atmospheric effects are also modeled. In addition, the effects of weather and atmospheric conditions on wake vortices 425, 435 are modeled. In this way, the user (i.e., the air traffic controller or the pilot) can visualize how weather and atmospheric conditions may affect aircraft 420, 430 and wake vortices 425, 435.

Figure 6:
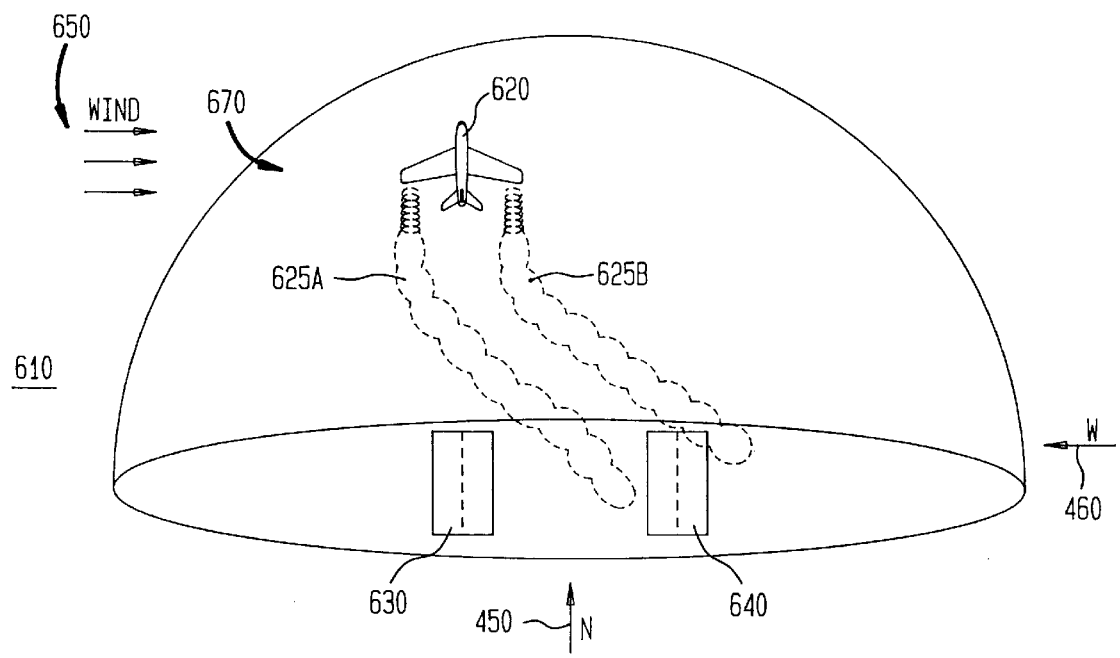
FIG. 6 illustrates a rendering of an airspace around an airport having multiple parallel runways.

For example, FIG. 6 illustrates a rendering 610 of an airspace 670 around an airport having a first runway 630 and a second runway 640. Rendering 610 depicts an aircraft 420 taking off from first runway 630. As aircraft 420 generates lift, aircraft 420 creates a wake vortex 625A and a wake vortex 625B. Rendering 610 depicts the modeling of wind 650 as wind 650 operates on wake vortices 625. A preferred embodiment of the present invention models each wake vortex 625A, 625B independently. Thus, the computer model of airspace 670 models the effect of wind 650 on each wake vortex 625A, 625B independently. As depicted in rendering 610, the easterly blowing wind 650 causes wake vortices 625 to venture over to second runway 640 posing a potential problem to aircraft (not shown) that may land or take off from second runway 640. In addition to displacing wake vortices 625, wind 650 may disrupt or completely break up wake vortices 625 as well. Other atmospheric conditions and weather may be similarly modeled and their effects on wake vortices 625 depicted as would be apparent.

Modeling Wake Vortices Using 3D Textures

A preferred embodiment of the present generates a computer, or mathematical, model of wake vortex 625 and renders the model for display using three-dimensional (3D) textures. Two-dimensional (2D) textures have been used in computer graphics to increase realism by applying a 2D texture to a polygon. Silicon Graphics, Incorporated, has developed a method for using 3D textures to generates a texture for a volume as opposed to a polygon. A discussion of 3D textures is found in U.S. Pat. No. 5,438,654, entitled *System and Method for Sharpening Texture Imagery in Computer Generated Interactive Graphics*, issued to Drebin et al. on Aug. 1, 1995, and U.S. Pat. No. 5,471,572, entitled *System and Method for Adding Detail to Texture Imagery in Computer Generated Interactive Graphics*, issued to Buchner et al. on Nov. 28, 1995, both of which are assigned to the assignee of the present invention and incorporated herein by reference.

Figure 7:
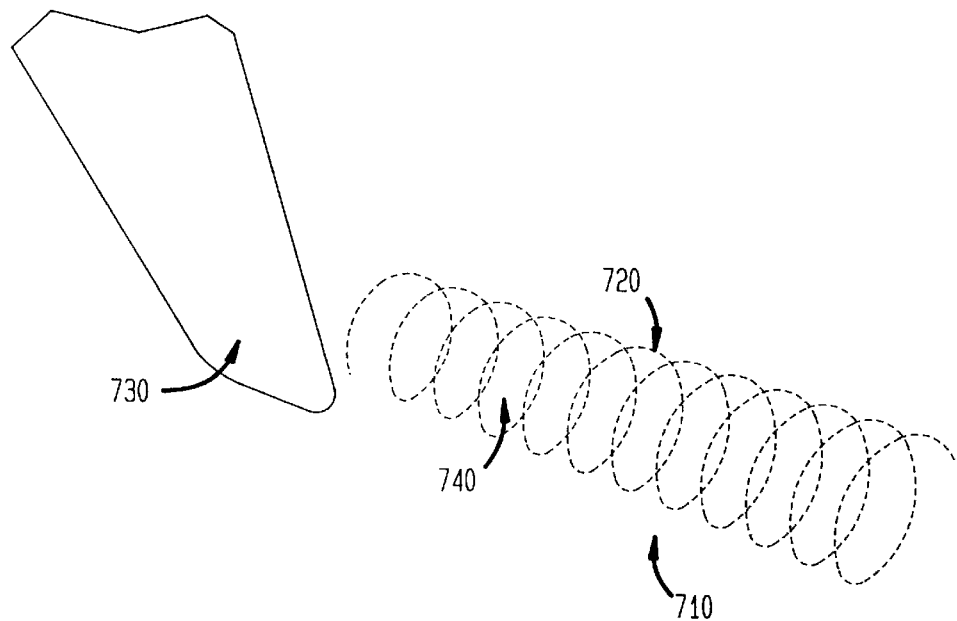
FIG. 7 illustrates a computer model of a wake vortex according to a preferred embodiment of the present invention.

FIG. 7 illustrates the generation of a model of a wake vortex 710 according to this embodiment of the present invention in further detail. This embodiment generates a model of wake vortex 625 in two parts referred to as volume simulation and 3D texture mapping, respectively. During volume simulation, a volume 720 bounding wake vortex 710 is simulated. Volume 720 begins at wingtip 730 and extends behind the aircraft until wake vortex 710 has dissipated. During 3D texture mapping, one or more 3D textures 740 are applied to volume 720 to obtain a model of wake vortex 710. Each of these parts is discussed in further detail below.

Volume Simulation

As discussed above, during volume simulation, volume 720 is simulated. Volume 720 represents the bounds of wake vortex 710. Two types of data are necessary to accurately simulate volume 720: environmental data and aircraft data. Environmental data includes wind speed, wind direction, temperature, relative humidity, dew point, precipitation, atmospheric pressure, frontal activity, etc. Aircraft data includes aircraft type, configuration (i.e, clean, landing gear position, etc.), weight, position, attitude, altitude, speed, etc. Both of these types of data are collected from either a ground-based station (i.e., airport control tower, etc.) or the aircraft itself via onboard sensors. In a preferred embodiment of the present invention, this data is collected in real time so that volume 720 can be simulated accordingly. The environmental data and the aircraft data are then used to compute the position and orientation of volume 720 based on theoretical and empirical knowledge of wake vortices. FARAIM, para. 7-53, 7-54, pp. 626–627.

In addition to environmental data and aircraft data, topological data may also be collected. Wake vortices generated at or near ground level are effected by local characteristics of the Earth's surface. For example, wake vortices are disrupted by buildings and trees. Wake vortices tend to roll along flat, open areas unimpeded. Thus, topological data may also be modeled to simulate wake vortex movement along the ground around airports, etc.

3D Texture Mapping

After volume 720 for wake vortex 710 is determined, one or more 3D textures 740 are applied to volume 720. A 3D texture is similar to a 2D texture except that the 3D texture pertains to volumes whereas the 2D texture pertains to surfaces. In essence, the 3D texture is a known collection of three dimensional data which can be scaled, rotated and translated to fit in various orientations within volume 720.

Figure 10A:
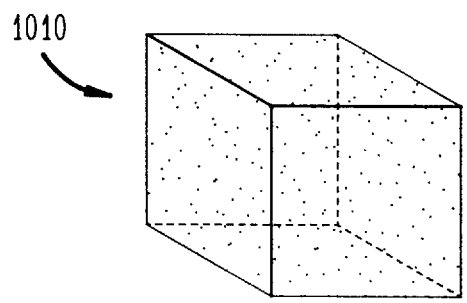
FIG. 10 illustrates two 3D textures that are used by various embodiments of the present invention.

FIG. 10 illustrates various 3D textures which may be used by the present invention. In addition, as discussed below, color may be used to displace or supplement these 3D textures. In one embodiment of the present invention, 3D texture 740 is a collection of randomly spaced points referred to as 3D texture 1010 as shown in FIG. 10A. 3D texture 1010 is effective in that as it is scaled down, or compressed, the points within 3D texture 1010 become more dense. Hence, a volume filled with compressed 3D textures 1010 appears nearly opaque. As 3D texture 1010 is scaled up, or expanded, the points within become less dense. Hence, a volume filled with expanded 3D textures 1010 appears translucent.

Using 3D texture 1010 to texture map volume 720 would be an effective way to enable a user to visualize wake vortex 710 as is shown in FIG. 7. Portions of volume 720 located nearest wingtip 730 are mapped with compressed 3D textures 1010 to appear as nearly opaque regions. Other portions of volume 720 located farther from wingtip 730 are mapped with 3D textures 1010 that are compressed proportionately less. Still other portions of volume 720 farthest from wingtip 730 are mapped with 3D textures 1010 that are expanded to appear virtually transparent. By scaling (i.e., compressing or expanding) 3D texture 1010 in this manner throughout volume 720, the relative strength of wake vortex 710 can be visualized. In addition to scaling, 3D texture 1010 can be rotated between each adjacent portion of volume 720 to create a tornado effect for wake vortex 710.

Figure 10B:
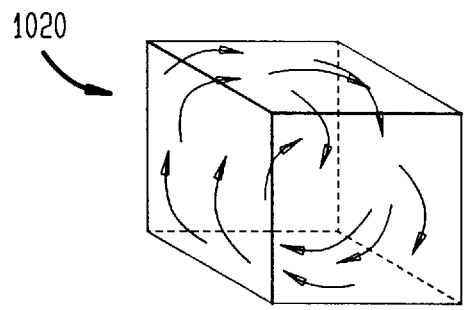

FIG. 10B illustrates a 3D texture 1020 which is used in a second embodiment of the present invention. 3D texture 1020 includes collection of arrows that indicate the rotational direction of wake vortex 710. As discussed above, 3D texture 1020 may be scaled to increase or decrease the density of the arrows in volume 720 in accordance with the strength of wake vortex 710, and rotated to create the tornado effect. In addition, the arrows of 3D texture 1020 provide rotational cues to the user.

As would be apparent, other 3D textures may be applied to volume 720. For example, colored 3D textures may be applied to volume 720. Portions of volume 720 may be filled with red 3D textures indicating that those portions of wake vortex 710 are very dangerous. Other portions may be filled with yellow 3D textures indicating that those portions of wake vortex 710 are less dangerous. Still other portions may be filled with blue 3D textures indicating that those portions of wake vortex 710 are relatively benign.

Rendering and Displaying

Once volume 720 has been simulated and texture mapped, volume 720 is rendered into a two-dimensional image. Rendering is a process well known in computer graphics systems where a three-dimensional volume, or scene, is processed into a two-dimensional image capable of being displayed on a flat screen such as a cathode ray tube (CRT). Accordingly, further discussion of the actual rendering is not necessary and would be apparent to artisans in the relevant areas.

However, the present invention contemplates rendering, in addition to wake vortices 710 and the aircraft that created them, an actual scene of the airspace surrounding the airport. The scene may include runways, buildings, and towers located in the airport. The scene may also include and identify hazards such as cranes, parachute jump zones, special or restricted airspace, noise abatement areas, and other such regions in the airspace a user must be cognizant of as he schedules transactions. These and other areas are rendered to provide the user with a realistic portrayal of the airspace surrounding the airport.

Operation of the Present Invention

Figure 8:
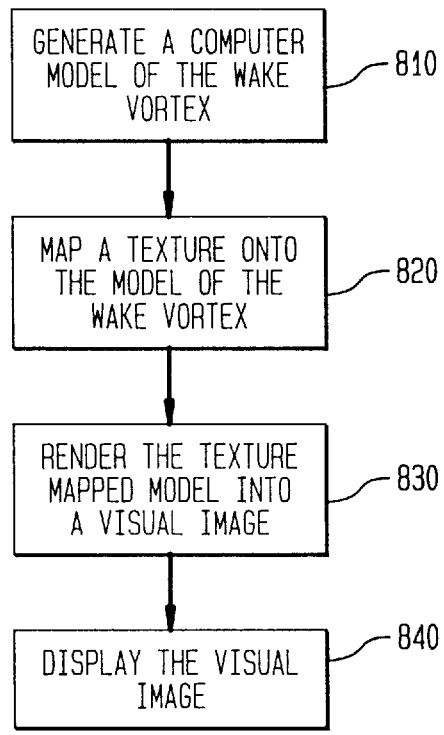
FIG. 8 is a flow diagram that illustrates the steps performed by the present invention.

FIG. 8 is a flow diagram illustrating the operations performed according to the present invention. In a step 810, a computer model of wake vortex 710 is generated. In a preferred embodiment, the computer model is a three dimensional volume 720 that bounds wake vortex 710. The computer model takes into account the characteristics of the aircraft that creates wake vortex 710 and the effects of the environment on wake vortex 710.

In a step 820, a texture is mapped onto the computer model of wake vortex 710 to create a texture mapped model. A preferred embodiment of the present invention uses 3D textures to fill volume 720 as discussed above. In a step 830, the texture mapped model is rendered into a two-dimensional image according to well known techniques of graphics processing. In a step 840, the two dimensional image is displayed to enable the user to visualize wake vortex 710.

Figure 9:
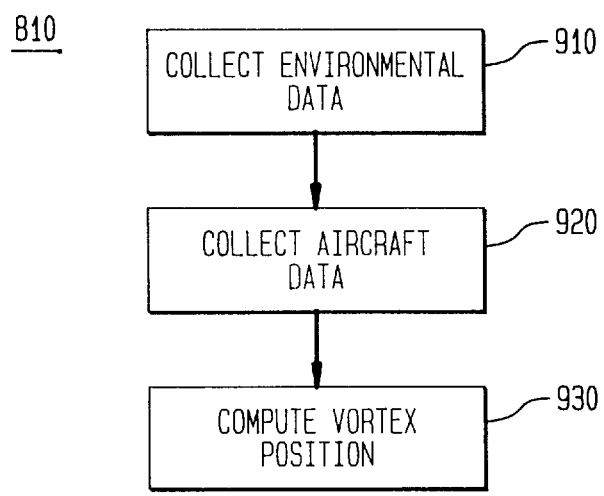
FIG. 9 is a flow diagram that illustrates the steps perform by step 810 in further detail.

FIG. 9 illustrates the operation of step 810 in further detail. In a step 910, environmental data is collected. The environmental data may be collected from sensors on board the aircraft, from sensors located at or near the ground in proximity of the airport, or received from various sources such as the National Weather Service, etc. In a step 920, aircraft data is collected. As with the environmental data, the aircraft data may be collected from the sensors on board the aircraft or from sensors located at or near the ground.

In a step 930, the environmental data and the aircraft data are used to compute a position and orientation of wake vortex 710. As discussed above, in a preferred embodiment of the present invention, a volume 720 for wake vortex 710 is computed based on the environmental data and the aircraft data.

Alternate Embodiments

The present invention has thus been described in terms of a air traffic control device. However, the present invention is not limited to such. For example, an embodiment contemplated by the present invention allows a pilot of an aircraft to visualize wake vortices. In this embodiment, wake vortices are simulated and rendered for aircraft that are presently near or have recently crossed the flight path of the aircraft flown by the pilot. This embodiment allows the pilot himself to avoid the wake vortices by making them "visible."

In a preferred embodiment, the pilot views the wake vortices through a "heads-up display." In this case, the wake vortices are superimposed over the actual scene including the aircraft generating the wake vortices. Such heads-up displays include devices such as transparent screens, windshield screens, projection systems, visors, eye pieces, etc, as would be apparent.

Conclusion

Although the invention has been described in detail in terms of specific embodiments, various modifications can be made without departing from the scope of the invention.

What is claimed is:

1. A method for displaying a visual image of a wake vortex created by an aircraft, the method comprising the steps of:

generating a model of the wake vortex;

mapping a texture of the wake vortex onto said model to create a texture mapped model of the wake vortex;

generating the visual image of the wake vortex from said texture mapped model; and displaying the visual image of the wake vortex on a display.

2. The method of claim 1, further comprising the steps of:

generating a visual image of the aircraft that created the wake vortex; and displaying said visual image of the aircraft on said display.

3. The method of claim 1, wherein the step of generating the visual image of the wake vortex comprises the step of generating the visual image of the wake vortex from a perspective selected by a user.

4. The method of claim 3, further comprising the steps of:

generating a visual image of the aircraft that created the wake vortex; and displaying said visual image of the aircraft on said display.

5. The method of claim 1, wherein the step of generating the visual image of the wake vortex comprises the step of generating the visual image from an actual perspective of the user.

6. The method of claim 5, wherein the step of displaying the visual image of the wake vortex on said display comprises the step of:

superimposing the visual image of the wake vortex on said display over an actual view of the aircraft creating the wake vortex.

7. The method of claim 1, wherein the step of generating said model of the wake vortex comprises the step of:

determining a bounding volume for the wake vortex.

8. The method of claim 1, further comprising, before said step of generating the visual image, a step of:

adjusting said model of the wake vortex in response to atmospheric conditions experienced by the aircraft and the wake vortex.

9. The method of claim 8, wherein the step of adjusting said model of the wake vortex comprises the step of adjusting said model of the wake vortex in response to at least one of wind speed, wind direction, dew point, relative humidity, temperature and precipitation.

10. The method of claim 1, wherein the step of generating said model of the wake vortex comprises the step of:

generating said model of the wake vortex based on a characteristic of the aircraft.

11. The method of claim 10, wherein the step of generating said model of the wake vortex comprises the step of:

generating said model of the wake vortex based on at least one of a type, a speed, an altitude, a heading, an angle of attack, a weight, a wing configuration, a wingspan, and a cleanliness of the aircraft.

12. The method of claim 10, wherein the step of generating said model of the wake vortex comprises the step of:

generating a three-dimensional model of the wake vortex.

13. The method of claim 12, wherein the step of generating the visual image of the wake vortex comprises the step of:

rendering said three-dimensional model of the wake vortex into a rendered image, wherein said rendered image is the visual image.

14. The method of claim 3, further comprising, before said step of generating the visual image, a step of:

changing said perspective of the visual image thereby allowing a user to obtain different views of the wake vortex.

15. The method of claim 1, further comprising a step of:

updating said model of the wake vortex over time in response to changes in said characteristics of the aircraft.

16. The method of claim 1, wherein said step of mapping a texture of the wake vortex onto said model comprises the step of:

scaling said texture being mapped onto a portion of the wake vortex to indicate a relative strength of said portion of the wake vortex.

17. The method of claim 16, wherein said step of scaling said texture comprises the step of:

compressing said texture being mapped to a portion of the wake vortex that is relatively near the aircraft.

18. The method of claim 16, wherein said step of scaling said texture comprises the step of:

expanding said texture being mapped to a portion of the wake vortex that is relatively far from the aircraft.

19. The method of claim 16, wherein said step of scaling said texture comprises the step of:

varying said scaling of said texture being mapped to a portion of the wake vortex based on the relative strength of the wake vortex in said portion.

20. The method of claim 1, wherein said step of mapping a texture of the wake vortex onto said model comprises the step of:

mapping a texture comprised of a collection of points onto said model.

21. The method of claim 20, wherein said step of mapping a texture comprised of a collection of points comprises the step of:

mapping a texture comprised of a collection of randomly spaced points onto said model.

22. The method of claim 1, wherein said step of mapping a texture of the wake vortex onto said model comprises the step of:

mapping a texture comprised of a collection of arrows onto said model.

23. The method of claim 1, wherein said step of mapping a texture of the wake vortex onto said model comprises the step of:

mapping a texture comprised of at least one color onto said model.

24. The method of claim 20, wherein said step of mapping a texture comprised of a collection of points onto said model comprises the step of:

applying a color to said texture comprised of a collection of points.

25. The method of claim 22, wherein said step of mapping a texture comprised of a collection of arrows onto said model comprises the step of:

applying a color to said texture comprised of a collection of arrows.

26. A method for scheduling transactions for a plurality of aircraft on a runway at an airport, the method comprising the steps of:

generating a visual image of a wake vortex created by each of the aircraft;

displaying said visual image of said wake vortex created by each of the aircraft on a display; and scheduling the transactions of the aircraft based on said displayed visual images thereby increasing a number of transactions for the runway while maintaining a given level of safety.

27. The method of claim 26, further comprising, before said step of generating a visual image, steps of:

determining an aircraft type for each of the aircraft; and obtaining a model of said wake vortex for each the aircraft.

28. The method of claim 27, wherein said model is based on a characteristic of said each of the aircraft, said characteristic including at least one of speed, altitude, heading, pitch, and configuration.

29. The method of claim 28, further comprising a step of:

updating said model of said wake vortex based on changes in said characteristic.

30. The method of claim 27, further comprising a step of:

updating said model of said wake vortex based on an atmospheric condition experience by each of the aircraft, said atmospheric condition including at least one of wind speed, wind direction, dew point, temperature and precipitation.

31. A system for displaying a visual image of a wake vortex created by an aircraft, the system comprising:

means for generating a model of the wake vortex;

means for mapping a texture of the wake vortex onto said model to create a texture mapped model of the wake vortex;

means for generating the visual image of the wake vortex from said texture mapped model; and means for displaying the visual image of the wake vortex.

32. The system of claim 31, further comprising:

means for generating a visual image of the aircraft that created the wake vortex.

33. The system of claim 31, further comprising:

means for selecting a perspective of the visual image, wherein said means for generating the visual image of the wake vortex comprises means for generating the visual image of the wake vortex based on said selected perspective.

34. The system of claim 33, further comprising:

means for generating a visual image of the aircraft that created the wake vortex.

35. The system of claim 31, wherein said means for generating the visual image of the wake vortex comprises means for generating the visual image from an actual perspective of the user.

36. The system of claim 35, wherein said means for displaying the visual image of the wake vortex comprises:

means for superimposing the visual image of the wake vortex over an actual view of the aircraft creating the wake vortex.

37. The system of claim 31, further comprising:

means for adjusting said model of the wake vortex in response to atmospheric conditions experienced by the aircraft and the wake vortex, said atmospheric conditions including at least one of wind speed, wind direction, dew point, relative humidity, temperature and precipitation.

38. The system of claim 31, wherein said means for generating said model of the wake vortex comprises:

means for generating said model of the wake vortex based on a characteristic of the aircraft, said characteristic including at least one of a type, a speed, an altitude, a heading, an angle of attack, a weight, a wing configuration, a wingspan, and a cleanliness of the aircraft.

39. The system of claim 31, wherein said model is a three-dimensional model of the wake vortex, and further comprising:

means for rendering said three-dimensional model of the wake vortex into a rendered image, wherein said rendered image is the visual image.

40. The system of claim 39, further comprising:

means for changing said perspective of the visual image thereby allowing a user to obtain different views of the wake vortex.

41. The system of claim 38, further comprising:

means for updating said model of the wake vortex over time in response to changes in said characteristics of the aircraft.

42. The system of claim 31, wherein said means for mapping a texture of the wake vortex onto said model comprises:

means for scaling said texture being mapped onto a portion of the wake vortex to indicate a relative strength of said portion of the wake vortex.

* * * * *